United States Patent
Sakoh

(10) Patent No.: US 7,898,888 B2
(45) Date of Patent: Mar. 1, 2011

(54) SEMICONDUCTOR MEMORY DEVICE HAVING MEMORY CELL AND REFERENCE CELL CONNECTED TO SAME SENSE AMPLIFIER AND METHOD OF READING DATA THEREOF

(75) Inventor: Takashi Sakoh, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 222 days.

(21) Appl. No.: 12/155,649

(22) Filed: Jun. 6, 2008

(65) Prior Publication Data
US 2008/0310241 A1    Dec. 18, 2008

(30) Foreign Application Priority Data
Jun. 18, 2007    (JP) .............................. 2007-160588
Jun. 18, 2007    (JP) .............................. 2007-160595

(51) Int. Cl.
*G11C 7/02*    (2006.01)
(52) U.S. Cl. ........................... 365/210.1; 365/189.011; 365/210.15
(58) Field of Classification Search .............. 365/210.1, 365/189.011, 210.15
See application file for complete search history.

(56) References Cited

U.S. PATENT DOCUMENTS

| 5,392,240 | A | 2/1995 | Muraoka |
| 5,801,586 | A * | 9/1998 | Ishizuka ..................... 327/545 |
| 7,327,622 | B2 | 2/2008 | Hamada |
| 2006/0221669 | A1 | 10/2006 | Hamada |

FOREIGN PATENT DOCUMENTS

| JP | 6-12860 | 1/1994 |
| JP | 10-135417 | 5/1998 |
| JP | 2006-278778 | 10/2006 |

* cited by examiner

*Primary Examiner*—Son Dinh
*Assistant Examiner*—Nam Nguyen
(74) *Attorney, Agent, or Firm*—McGinn IP Law Group, PLLC

(57) ABSTRACT

A semiconductor memory device includes a sense amplifier, first and second bit lines connected to the sense amplifier, a first reference cell connected to the first bit line, and a second reference cell connected to the second bit line. A reference potential is simultaneously written to the first and second reference cells. Further, a dummy cell may be provided to be simultaneously, with the reference cell, with the reference potential.

6 Claims, 14 Drawing Sheets

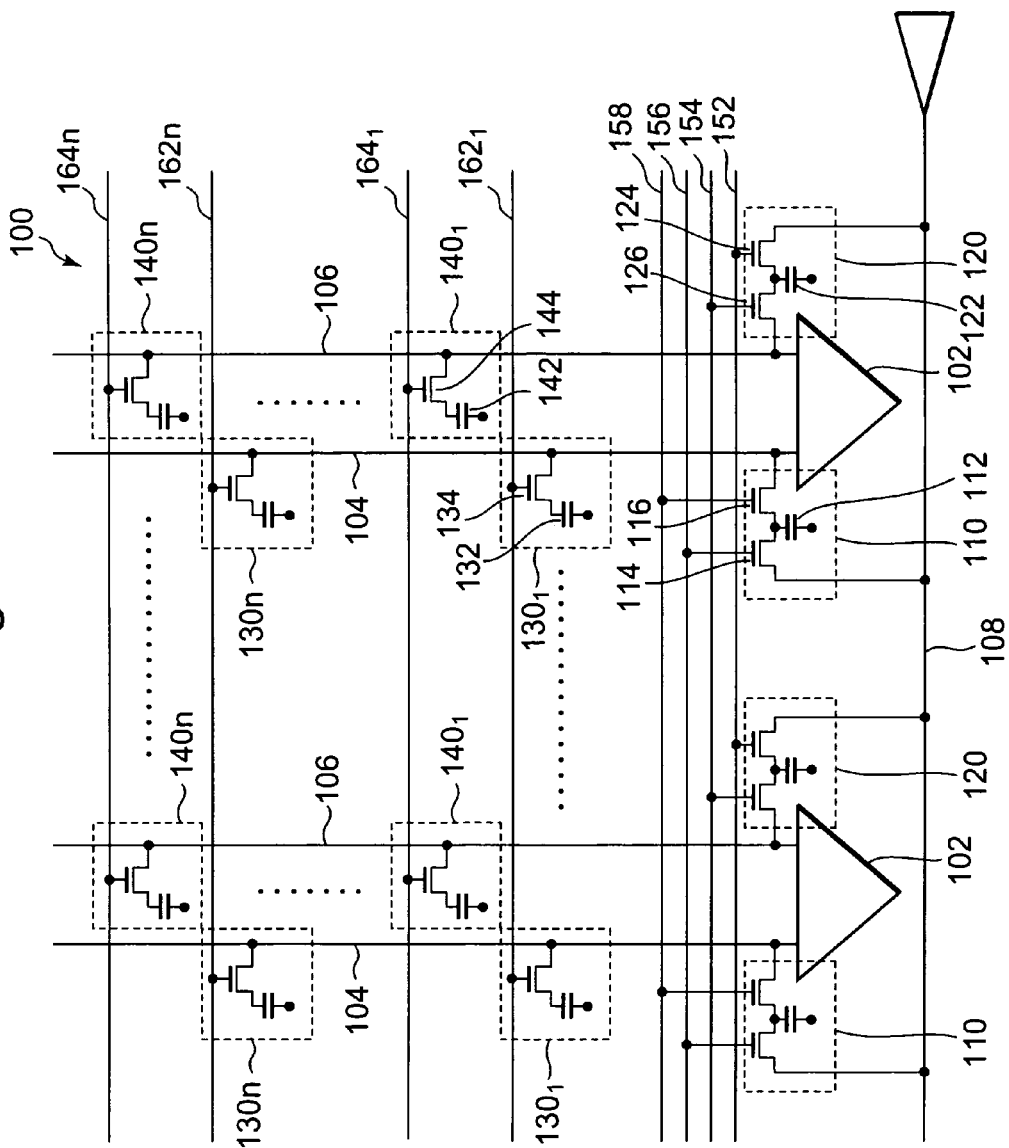

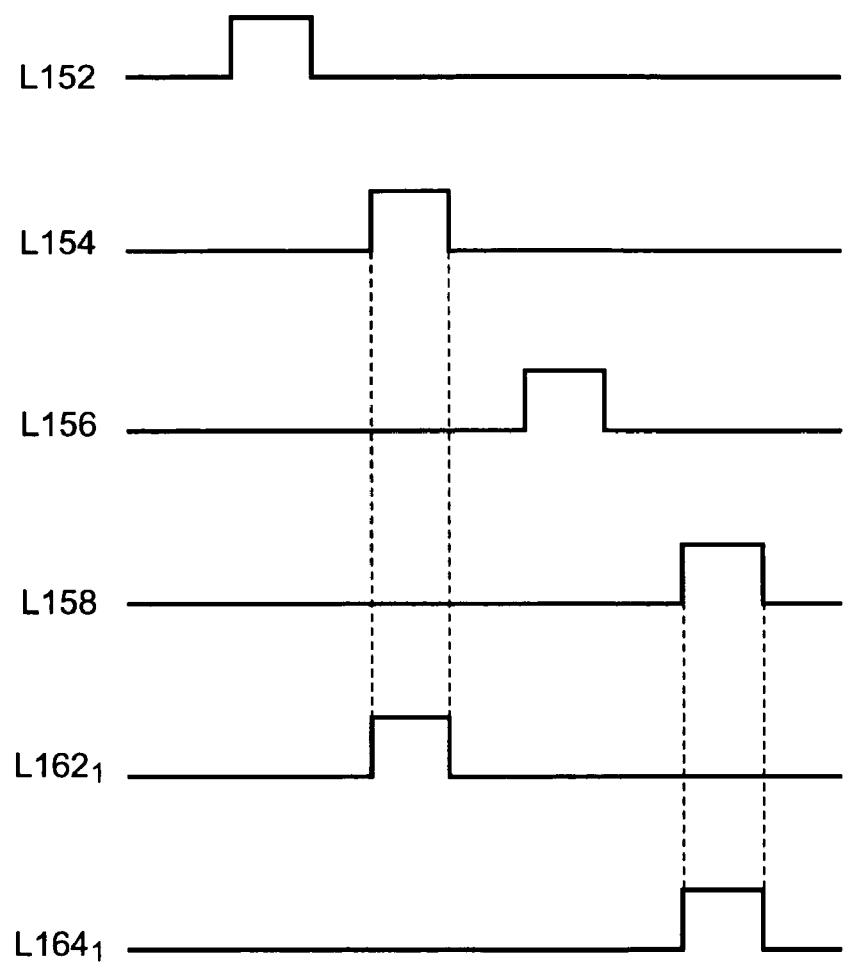

SEMICONDUCTOR MEMORY DEVICE HAVING MEMORY CELL AND REFERENCE CELL CONNECTED TO SAME SENSE AMPLIFIER AND METHOD OF READING DATA THEREOF

BACKGROUND OF THE INVENTION

1. Field of the Invention

The present invention relates to a semiconductor memory device and a data reading method thereof. Particularly, it relates to a semiconductor memory circuit constituting a logic embedded memory in which a semiconductor memory circuit is embedded on a substrate identical with that for the logic circuit, as well as a data reading method thereof.

2. Description of Related Art

FIG. 10 is an example of a logic embedded memory. A logic circuit 206 and other peripheral circuits (high speed IO circuit 208, AD converter 210, DA converter 212) are disposed on a substrate identical with that for a semiconductor memory device such as DRAM 202 or SRAM 204. For the semiconductor memory circuit in the logic embedded memory described above, high speed operation is required in comparison with existent general-purpose semiconductor memory circuits.

On the other hand, FIG. 11 is a circuit diagram showing an existent semiconductor memory device, for example, in Japanese Laid Open Patent Application No. 2006-278778. In a semiconductor memory device 100, a bit line 104 and a bit line 106 are connected to a sense amplifier 102. A reference cell 110 and a reference cell 120 are connected respectively to the bit line 104 and the bit line 106. The reference cell 110 and the reference cell 120 are connected to a common potential line 108. Writing of the reference potential to the reference cell 110 and the reference cell 120 are conducted through the potential line 108 as to be described later.

The reference cell 110 is constituted with a capacitor 112 and transistors 114, 116. In the same manner, the reference cell 120 is constituted with a capacitor 122 and transistors 124, 126. Word lines 152, 154, 156, and 158 are connected to the gates of the transistors 124, 126, 114, and 116, respectively.

Memory cells $130_1$ to $130_n$ are connected to the bit line 104. n is an integer of 2 or greater and, for example, 128 or 256. Further, memory cells $140_1$ to $140_n$ are connected to the bit line 106. Each of the memory cells $130_1$ to $130_n$ is constituted with the capacitor 132 and the transistor 134. The word lines $162_1$ to $162_n$ are connected to the gates of the transistors 134 of the memory cells $130_1$ to $130_n$ respectively. In the same manner, each of the memory cells $140_1$ to $140_n$ is constituted with the capacitor 142 and the transistor 144. Word lines $164_1$ to $164_n$ are connected to the gates of the transistors 144 of the memory cells $140_1$ to $140_n$, respectively.

The reading operation of the data in the semiconductor memory device 100 is to be described with reference to the timing chart of FIG. 12. In the drawing, the potentials for the word lines 152, 154, 156, 158, $162_1$, $164_1$ are represented respectively by lines L152, L154, L156, L158, L$162_1$, and L$164_1$. Reading of data from the memory cell $130_1$ and the memory cell $140_1$ continuously is taken as an example in this case.

At first, by activating the word line 152, and thereby turning the transistor 124 on, a reference potential is written to the reference cell 120 through the potential line 108. The reference potential is set, for example, to ½ Vcc (one-half of the power source potential). "Reference potential is written to the reference cell" means to render one end of the capacitor in the reference cell in a state conducted with the potential line by turning, among the transistors constituting the reference cells, the transistor connected to the potential line to on. Then, after turning the transistor 124 to OFF by deactivating the word line 152, the word line 154 and the word line $162_1$ are activated. Then, the transistor 126 and the transistor 134 are turned on, the potential of the memory cell $130_1$ and the potential of the reference cell 120 are compared by the sense amplifier 102, by which the data is read from the memory cell $130_1$.

Successively, by turning the transistor 114 to on by activating the word line 156, the reference potential is written through the potential line 108 to the reference cell 110. Then, after turning the transistor 114 to OFF by deactivating the word line 156, the word line 158 and the word line $164_1$ are activated. This turns the transistor 116 and the transistor 144 to on and the data is read from the memory cell $140_1$.

FIG. 13A and the FIG. 13B are graphs showing the change of the potential of the bit line 104, bit line 106, reference cell 120 and memory cell $130_1$ upon reading the data. FIG. 13A and the FIG. 13B correspond to the cases where the potential read from the memory cell $130_1$ are high and low, respectively. In the graphs, the ordinate and the abscissa represent the potential V and the time t, respectively. The potentials of the bit line 104, the bit line 106, the reference cell 120, and the memory cell $130_1$, are represented by the line L104, the line L106, the line L120 and the line L$130_1$, respectively. Further, the time at which the sense amplifier 102 is activated is represented by an arrow A1, and the time at which equalization of the bit lines 104, 106 is started is represented by an arrow A2.

As shown in FIG. 13A, in a case where the potential read from the memory 130, is high, when the sense amplifier 102 is activated, the potentials of the bit line 104 and the bit line 106 approach high and low, respectively. Correspondingly, the potential of the reference 120 also approaches low. On the other hand, as shown in FIG. 13B, in a case where the potential read from the memory cell $130_1$ is low, when the sense amplifier 102 is activated, the potentials of the bit line 104 and the bit line 106 approach low and high respectively. Correspondingly, the potential of the reference cell 120 also approaches high.

Such technologies are also shown in Japanese Laid Open Patent Application No. Hei 06(1994)-012860 or Hei 10(1998)-135417.

In the semiconductor memory device 100 as shown in FIG. 11, a plurality (for example, several thousands) of reference cells 110 are connected to a potential line 108. Then, writing of the reference potential to all of the reference cells 110 is conducted simultaneously through the potential line 108. Specifically, in a case where the potential of the reference 110 is low, charges are supplied from the potential line 108 to the reference cell 110. In a case where the potential of the reference cell 110 is high, charges are discharged from the reference cell 110 to the potential line 108.

Accordingly, in a case where the potential of most of the reference cells 110 is low, the potential of the potential line 108 is temporarily put to a state lower than the reference potential Vref as shown by line L108 in FIG. 14A. On the contrary, in a case where the potential of most of the reference cells 110 is high, the potential of the potential line 108 is temporarily put to a state higher than the reference voltage Vref as shown by L108 in FIG. 14B. In FIG. 14A and FIG. 14B, the ordinate and the abscissa represent the potential V and the time t, respectively.

Such a temporary potential fluctuation of the potential line 108 causes no problem in the low speed operation as in the operation of general-purpose DRAM. In a case where the potential of most of the reference cells 110 is low, the time during which the word line 156 is activated is long as shown in FIG. 11, and the potential of the capacitor 112 (shown by line L112) can therefore be increased to the reference potential Vref. Also in a case where the potential of most of the reference cells 110 is high, the potential of the capacitor 112 can be lowered to the reference potential Vref during activation of the word line 156.

However, during high speed operation as of the semiconductor memory device in the logic embedded memory as an example of which is shown in FIG. 10 the time during which the word line 156 is activated is short as shown in FIG. 14A and FIG. 14B. The word line 156 is therefore deactivated before the potential of the capacitor 112 reaches a predetermined reference potential Vref. Data reading from each of the memory cells $140_1$ to $140_n$ is thus conducted in a state where the potential of the reference cell 110 is apart from the reference potential Vref. This leads to an error for the data reading.

For example, in a case of reading data from the memory cells $140_1$ to $140_n$ at the low potential in a state where the potential of the reference cell 110 is lower than the reference potential Vref, the potential difference between both of the cells is decreased. The differential amplification by the sense amplifier 102 may therefore not be conducted exactly. This is identical also in a case of reading the data from the memory cells $140_1$ to $140_n$ at high potential in a case where the potential of the reference cell 110 is higher than the reference potential Vref.

While the reference cell 110 has been taken as an example in the foregoing descriptions, it will be apparent that the same problem as in the reference cell 110 occurs also for the reference cell 120.

SUMMARY OF THE INVENTION

A semiconductor memory device according to an exemplary aspect of the present invention is a semiconductor memory device of conducting data reading by comparison between the potential of the memory cell and the reference potential of the reference cell, including first and second bit lines connected to one identical sense amplifier, a first reference cell connected to the first bit line, a second reference cell connected to the second bit line, a dummy cell disposed separately from the first and the second reference cells, a first capacitor disposed in the reference cell, a second capacitor disposed in the reference cell, and a third capacitor disposed in the dummy cell, in which writing of the reference potential to the first and the third capacitors are started simultaneously.

Further, the data reading method according to the present invention is a method of reading the data from the semiconductor memory device, including a step of starting writing of the reference potential is started simultaneously to the first and the third capacitors.

In the present invention, writing of the reference potential to the first and the third capacitors is started simultaneously. That is, upon writing of the reference potential to the reference cell, writing of the reference potential is conducted also to the dummy cell disposed separately from the reference cell.

Accordingly, in a case where the lowering of the potential of the potential line for supplying the reference potential to the reference cell occurs, charges are supplied from the dummy cell to the potential line. On the other hand, in a case where the potential increase of the potential line occurs, charges are discharged from the potential line to the dummy cell. This can suppress the potential fluctuation of the potential line. Accordingly, even in a high speed operation, it is possible to prevent reading of the data from the memory cell in a state where the potential of the reference cell is apart from a predetermined reference potential.

According to the present invention, a semiconductor memory device excellent in the reliability upon data reading, and a data reading method thereof are attained.

A semiconductor memory device according to another exemplary aspect of the present invention is a semiconductor memory device of conducting data reading by comparison between the potential of the memory cell and the reference potential of the reference cell, including first and second bit lines connected to one identical sense amplifier, a first reference cell connected to the first bit line, a second reference cell connected to the second bit line, in which writing of the reference potential to the first and the second reference cells are started simultaneously.

Further, the data reading method according to the present invention is a method of reading the data from the semiconductor memory device, including a step of starting writing of the reference potential is started simultaneously to the first and the second reference cells.

In the present invention, writing of the reference potential to the first and the second reference cells is started simultaneously. That is, upon writing of the reference potential to the reference cell contributing to data reading at a certain time (for example, specified as the first reference cell), writing of the reference potential is conducted also to the reference cell not contributing to data reading (for example, specified as the second reference cell).

Accordingly, in a case where the lowering of the potential of the potential line for supplying the reference potential to the first reference cell occurs, charges are supplied from the second reference cell to the potential line. On the other hand, in a case where the potential increase of the potential line occurs, charges are discharged from the potential line to the second reference cell. This can suppress the potential fluctuation of the potential line. Accordingly, even in a high speed operation, it is possible to prevent reading of the data from the memory cell in a state where the potential of the first reference cell is apart from a predetermined reference potential.

According to the present invention, a semiconductor memory device excellent in the reliability upon data reading, and a data reading method thereof are attained.

BRIEF DESCRIPTION OF THE DRAWINGS

The above and other exemplary aspects, advantages and features of the present invention will be more apparent from the following description of certain exemplary embodiments taken in conjunction with the accompanying drawings, in which:

FIG. 11 is a circuit diagram showing an existent semiconductor memory device.

FIG. 12 is a timing chart for explaining the reading operation of data in the semiconductor memory device in FIG. 11.

DETAILED DESCRIPTION OF THE EXEMPLARY EMBODIMENTS

First Embodiment

Figure 1:
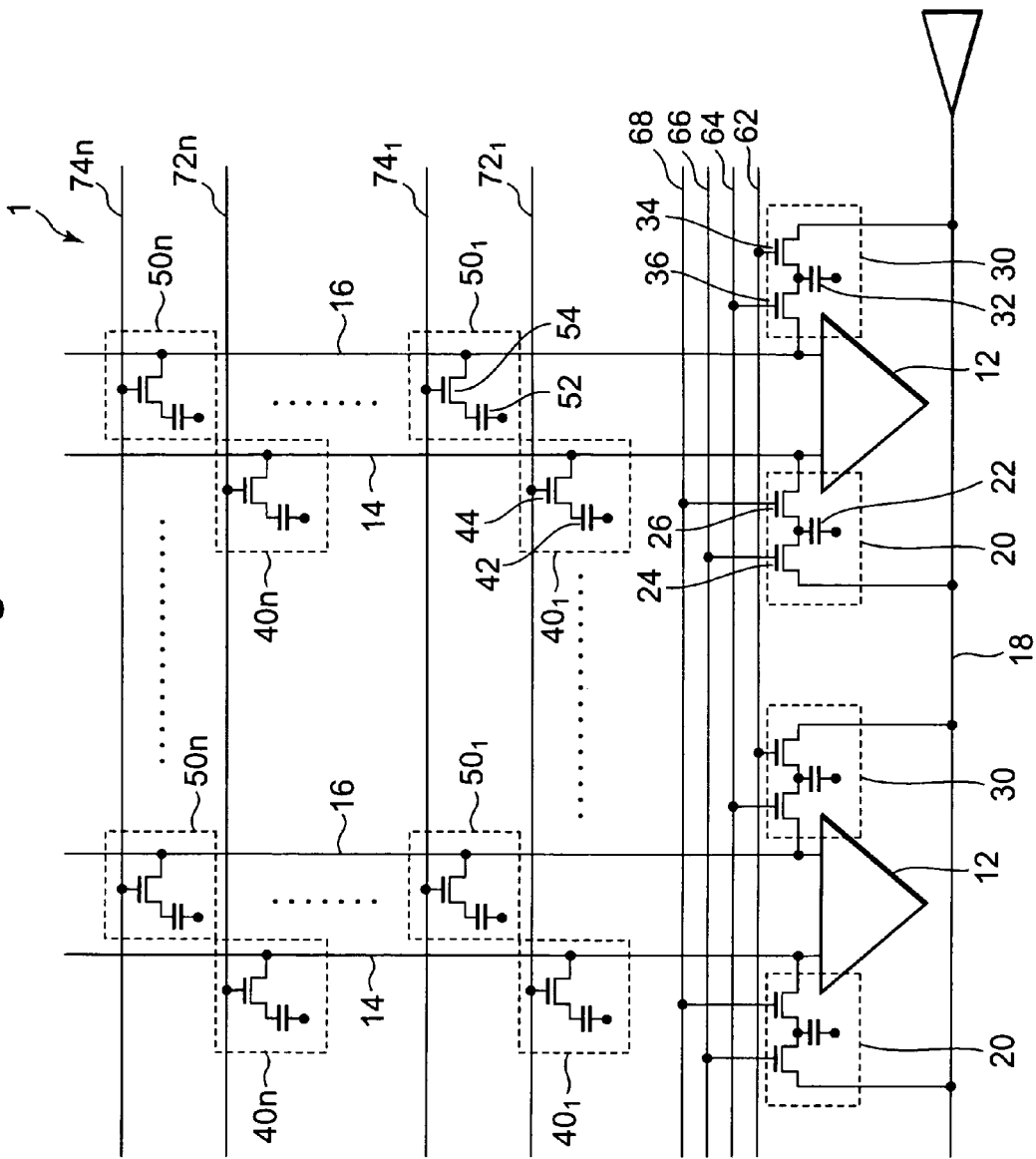
FIG. 1 is a circuit diagram showing a first exemplary embodiment of a semiconductor memory device according to the present invention.
Figure 10:
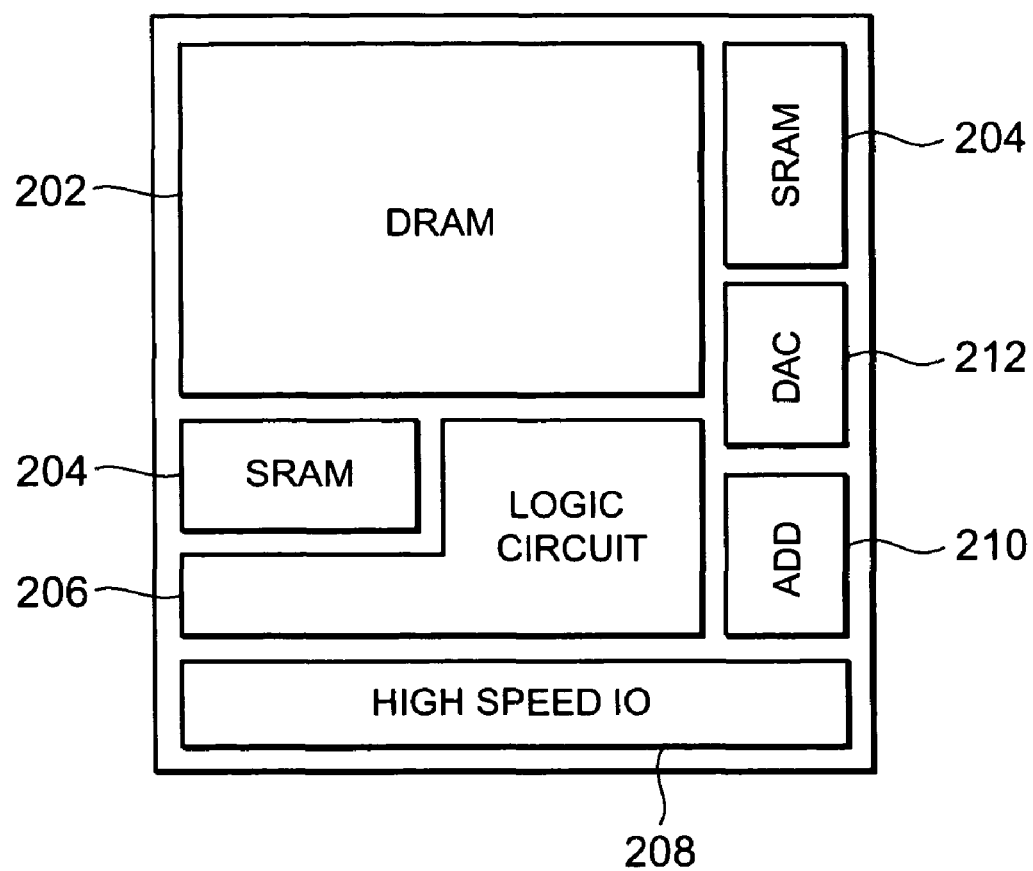
FIG. 10 is a plan view showing an example of a logic embedded memory.
Figure 13A:
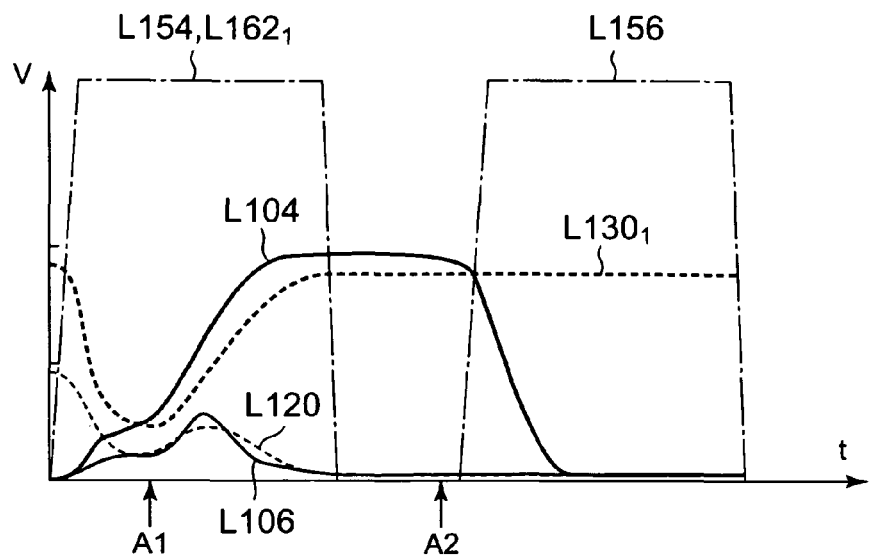
FIGS. 13A and 13B are graphs showing the change of potential of a bit line, etc. upon data reading in the semiconductor memory device in FIG. 12.
Figure 13B:
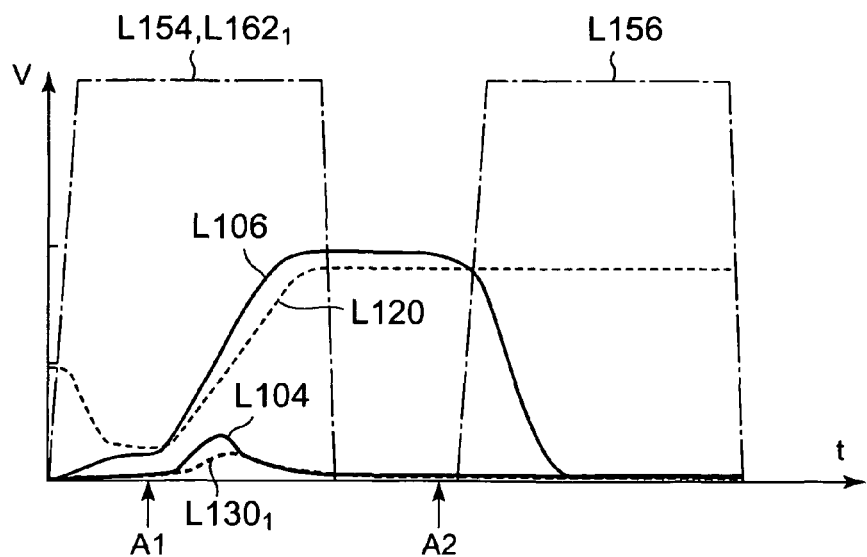
Figure 14A:
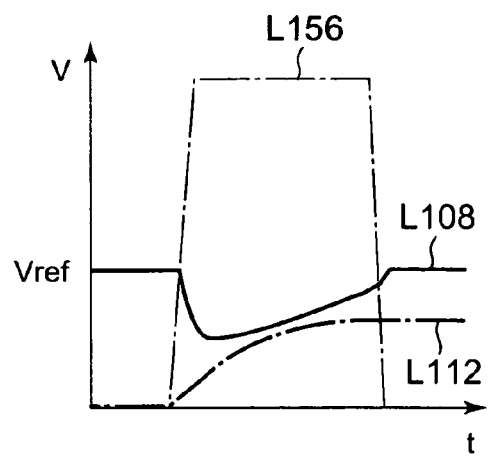
FIGS. 14A and 14B are graphs for explaining problems in the semiconductor memory device of FIG. 12.
Figure 14B:
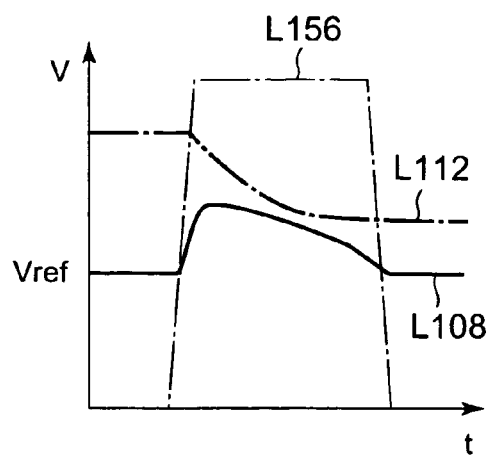
Figure 15:
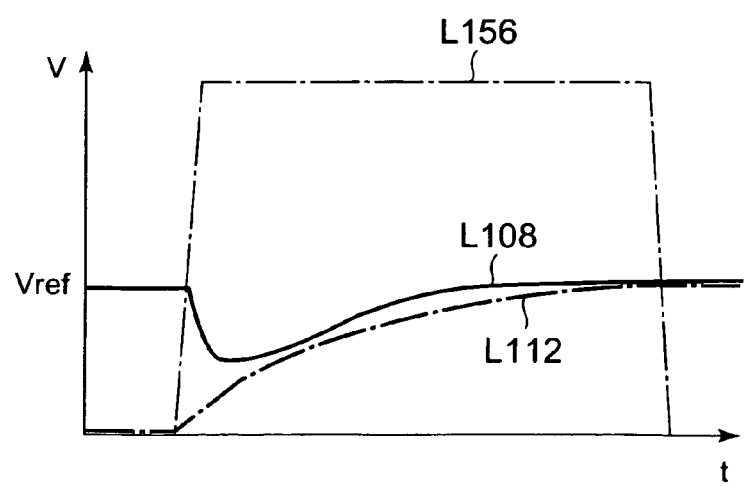
FIG. 15 is a graph for explaining problems in the semiconductor memory device in FIG. 12.

FIG. 1 is a circuit diagram showing the first exemplary embodiment of a semiconductor memory device according to the present invention. DRAM 1 is a semiconductor memory device of conducting reading of data by comparison between the potential of a memory cell and a reference potential of a reference cell and includes a bit line 14 (first bit line), a bit line 16 (second bit line), a reference cell 20 (first reference cell), and a reference cell 30 (second reference cell). DRAM 1 is constituted such that writing of the reference potential to the reference cell 20 and the reference cell 30 is started simultaneously. Specifically, the semiconductor memory device is provided with a control circuit, having a function for controlling such a timing that a later described word line 66 (first word line) and a word line 62 (second word line) are activated simultaneously. The control circuit is, for example, provided in the DRAM 202 or the logic circuit 206 of FIG. 10.

The bit line 14 and the bit line 16 are connected to an identical sense amplifier 12. The reference cell 20 and the reference cell 30 are connected to the bit line 14 and the bit line 16, respectively. The reference cell 20 and the reference cell 30 are connected to a common potential line 18. The reference potential is written to the reference cell 20 and the reference cell 30 through the potential line 18.

The reference cell 20 comprises the capacitor 22 (first capacitor), a transistor 24 (first transistor), and a transistor 26. The transistor 24 is connected at one of a source and a drain to the potential line 18 and at the other of them to one end of the capacitor 22. The other end of the capacitor 22 is connected, for example, to ½ Vcc. The transistor 26 is connected at one of a source and a drain to the bit line 14 and at the other of them to the one end of the capacitor 22. A word line 66 (first word line) and a word line 68 are connected to the gates of the transistor 24 and the transistor 26, respectively.

The reference cell 30 is composed of the capacitor 32 (second capacitor), a transistor 34 (second transistor) and a transistor 36. The transistor 34 is connected at one of a source and a drain to the potential line 18 and at the other of them to one end of the capacitor 32. The other end of the capacitor 32 is connected, for example, to ½ Vcc. The transistor 36 is connected at one of a source or a drain to the bit line 16 and at the other of them to the one end of the capacitor 32. A word line 62 (second word line) and a word line 64 are connected to the gates of the transistor 34 and the transistor 36, respectively. And the word line 66 (first word line) and the word line 62 (second word line) are connected to a control circuit, not shown, having a function for controlling such a timing that the word lines 66 and 62 are activated simultaneously.

Memory cells $40_1$ to $40_n$ are connected to the bit line 14. n is an integer of 2 or greater, and for example, 128 or 256. Each of the memory cells $40_1$ to $40_n$ is composed of a capacitor 42 and a transistor 44. The transistor 44 is connected at one of a source and a drain to a bit line 14 and the other of them to one end of the capacitor 42. The other end of the capacitor 42 is connected, for example, to ½ Vcc. The word lines $72_1$ to $72_n$ are connected to the gates of the transistors 44 of the memory cells $40_1$ to $40_n$, respectively.

Memory cells $50_1$ to $50_n$ are connected to the bit line 16. Each of the memory cells $50_1$ to $50_n$ comprises a capacitor 52 and a transistor 54. The transistor 54 is connected at one of a source and a drain to the bit line 16 and the other of them to one end of the capacitor 52. The other end of the capacitor 52 is connected, for example, to ½ Vcc. The word lines $74_1$ to $74_n$ are connected to the gates of the transistors 54 of the memory cells $50_1$ to $50_n$, respectively.

Figure 2:
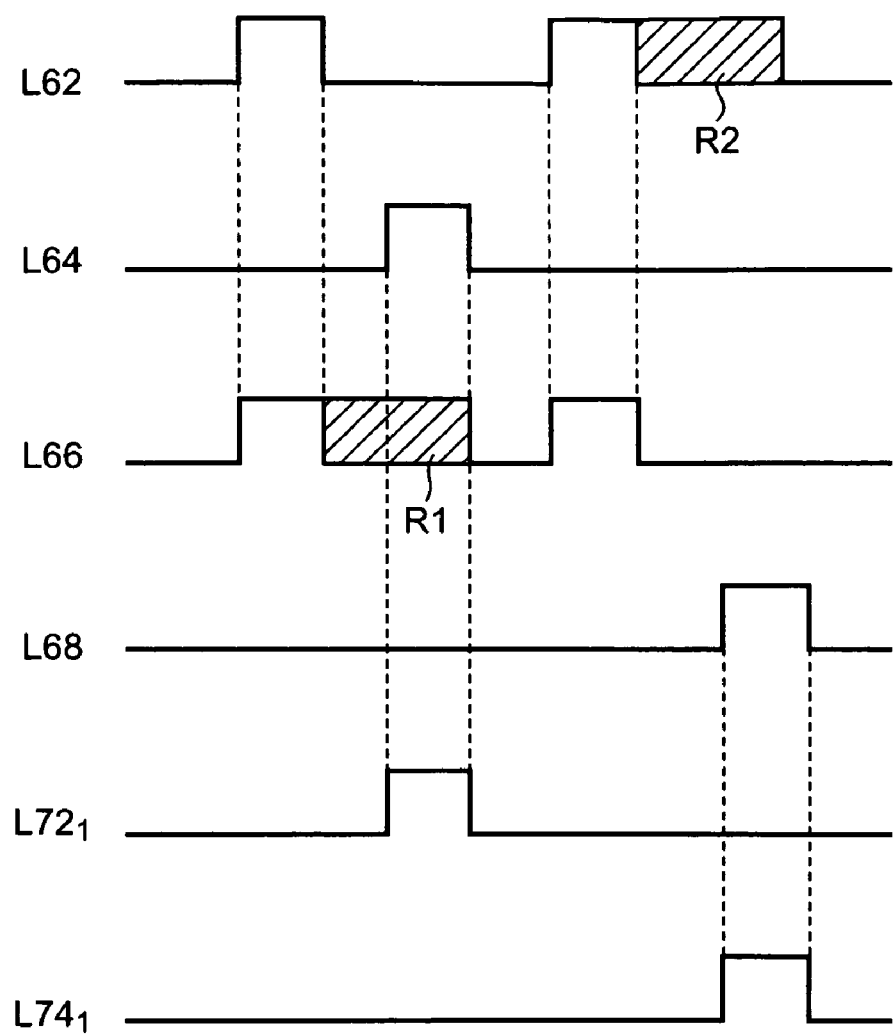
FIG. 2 is a timing chart for explaining the reading operation of data in the semiconductor memory device of FIG. 1.

Description is to be made to the data reading operation in DRAM 1 as a preferred embodiment of the data reading method according to the present invention with reference to a timing chart of FIG. 2. In the drawing, potentials of the word lines 62, 64, 66, 68, $72_1$, $74_1$ are represented by lines L62, L64, L66, L68, $L72_1$, $L74_1$, respectively. In this embodiment, an example of conducting reading of data continuously from the memory cell $40_1$ and the memory cell $50_1$ is shown as an example.

Turning the transistor 34 on by activation of the word line 62 writes a reference potential through the potential line 18 to the reference cell 30. In this case, the transistor 24 is also turned on by activation of the word line 66 at the same time as for the word line 62. This also writes a reference potential through the potential line 18 to the reference cell 20 at the same time as for the reference cell 30. The reference potential is set, for example, to ½ Vcc (one-half of the power source potential).

The word line 66 can be deactivated at an arbitrary time within a shaded area R1. That is, it is preferable that writing of a reference potential to the reference cell 20 and the reference cell 30 is started simultaneously, but the writing of the reference potential to the reference cells 20 and 30 may not be ended simultaneously. In other words, the time to write a reference potential to the reference cell 20 may be different from that to write the reference potential to the reference cell 30. In this case, the time to write a reference potential to a reference cell not contributing to data reading at a certain time (referred to as a reference cell 20) is longer than that to write a reference potential to a reference cell contributing to data reading at a certain time (referred to as a reference cell 30).

Then, after turning the transistor 34 to off by the deactivating the word line 62, the word line 64 and the word line $72_1$ are activated. Then, the transistor 36 and the transistor 44 are turned on, and the potential of the memory cell $40_1$ and the potential of the reference cell 30 are compared by a sense amplifier 12, by which data is read from the memory cell $40_1$. Then, the transistor 36 and the transistor 44 are turned off by deactivating the word line 64 and the word line $72_1$.

Successively, by turning on the transistor 24 by activation of the word line 66, the reference potential is written by way of the potential line 18 to the reference cell 20. In this case, activation of the word line 62 at the same time as for the word line 66 also turns on the transistor 34. This also writes the reference potential by way of the potential line 18 to the reference cell 30 at the same time as for the reference 20. The word line 62 can be deactivated at an arbitrary time within a shaded area R2. Then, after turning off the transistor 24 by deactivating the word line 66, the word line 68 and the word line $74_1$ are activated. This turns the transistor 26 and the transistor 54 and data is read from the memory cell $50_1$. Then, the transistor 26 and the transistor 54 are turned off by deactivating the word line 68 and the word line $74_1$.

The effect of this embodiment is to be described. In this embodiment, writing of the reference potential to the reference cell 20 and the reference cell 30 is started simultaneously. That is, upon writing of the reference potential to a reference cell contributing to data reading at a certain time (for example, referred to as a reference cell 20), the reference potential is written also to a reference cell not contributing to data reading (for example, referred to as a reference cell 30).

Accordingly, in a case where potential lowering occurs to the potential line 18 that supplies the reference potential to the reference cell 20, charges are supplied from the capacitor 32 constituting the reference cell 30 to the potential line 18. On the other hand, in a case where potential increase of the potential line 18 occurs, charges are discharged from the potential line 18 to the capacitor 32 constituting the reference cell 30. This can suppress the potential fluctuation of the potential line 18. Accordingly, it is possible to prevent reading of the data from each of the memory cells $50_1$ to $50_n$ in a state where the potential of the reference cell 20 is apart from a predetermined reference potential. In the same manner, this can prevent reading of the data from each of the memory cells $40_1$ to $40_n$ in a state where the potential of the reference cell 30 is apart from a predetermined reference potential. Since this stabilizes the potential written to the reference cell, the reading operation from the memory cell is stabilized to enlarge the operation margin of DRAM 1. Accordingly, it is possible to sufficiently follow a high speed operation as required for the logic embedded memory.

Further, the potential fluctuation of the potential line 18 can be suppressed by making the time to write the reference potential to the reference cell not contributing to data reading longer than that to write the reference potential to the reference cell contributing to data reading.

By the way, as a method of stabilizing the potential written to the reference cell, it may be considered to deactivate the transistor of the reference cell connected to the bit line before activation of the sense amplifier as disclosed in the Patent Document 2. This can prevent the potential of the reference cell from following the potential fluctuation of the bit line upon differential amplification by the sense amplifier.

However, such a method requires a certain extent of time from writing of the reference potential by turning on the transistor of the reference cell to the turning off of the transistor. This makes it difficult to shorten the time from the rising of the word line to the activation of the sense amplifier. This brings about a problem that the operation speed is retarded, for example, in DRAM (particularly, logic embedded DRAM) requiring high speed random access. Accordingly, the method of the Patent Document 2 cannot be applied to the logic embedded memory requiring high speed operation.

Further, the method described above also involves a problem that the balance of capacitance is lost between two bit lines connected to a sense amplifier upon differential amplification by the sense amplifier. This is because the capacitor is connected to one bit line, whereas the capacitor is not connected to the other bit line. This causes an error in the reading of data. Accordingly, the method of this embodiment is excellent over the method of the Patent Document 2 as a method of stabilizing the potential written to the reference cell.

Second Embodiment

Figure 3:
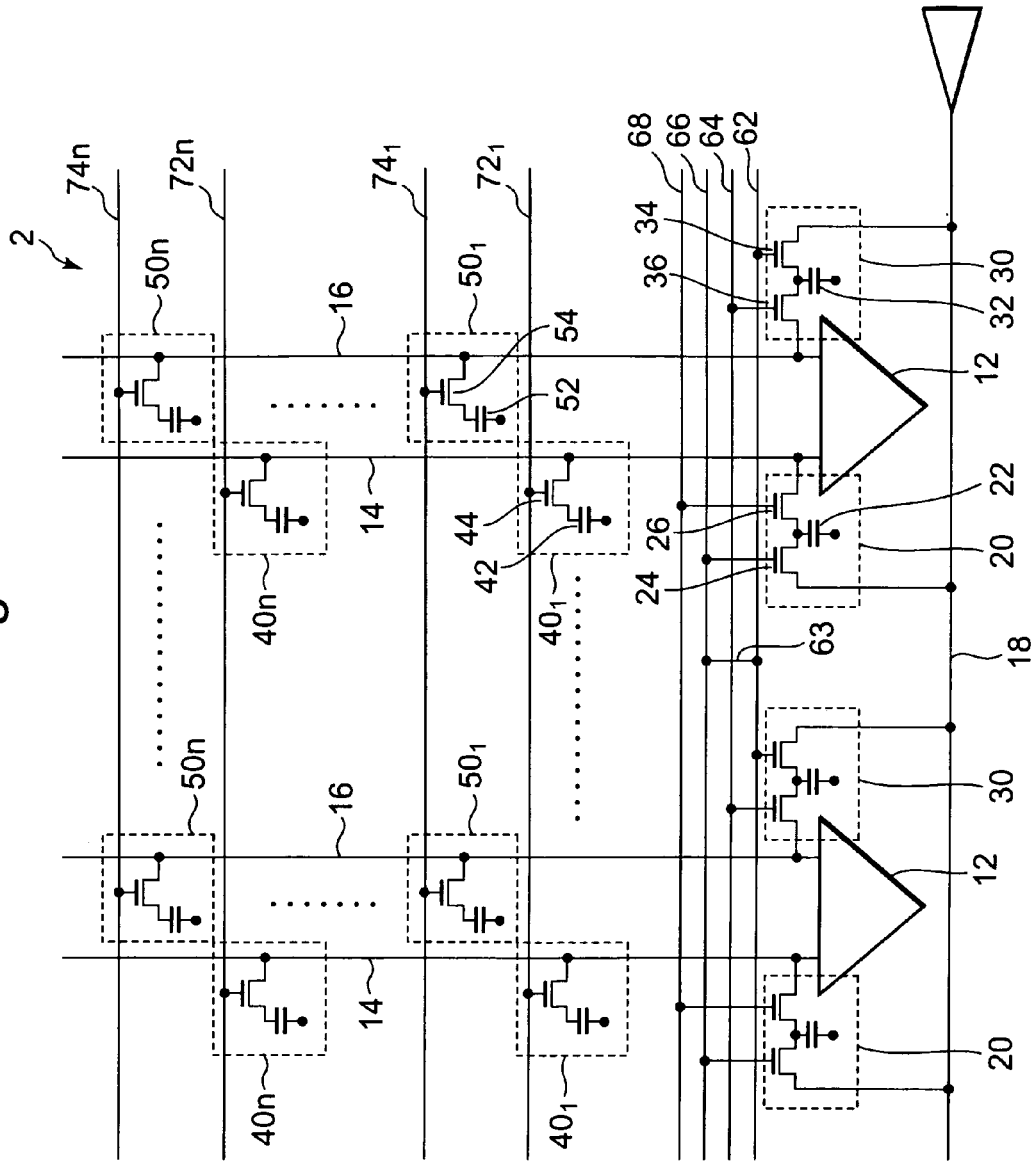
FIG. 3 is s circuit diagram showing a second exemplary embodiment of a semiconductor memory device according to the present invention.

FIG. 3 is a circuit diagram showing the second exemplary embodiment of the semiconductor memory device according to the present invention. In DRAM 2, a word line 62 and a word line 66 are connected with each other via a wring 63. In this embodiment, writing a reference potential to a reference 20 and a reference 30 is therefore started simultaneously and ended simultaneously. Other constitutions and behaviors of DRAM 2 are identical with those of DRAM 1.

In this embodiment, mutual connection between the word lines 62 and 66 facilitates writing of the reference potential to the reference cells 20 and 30 simultaneously. Since this embodiment needs no control circuit that controls a time to write a reference potential to both reference cells 20 and 30, the circuit configuration of DRAM 2 is simplified by just that much. This contributes to size and cost reduction of the DRAM 2. Other effects of this embodiment are identical with those of the first embodiment.

Third Embodiment

Figure 4:
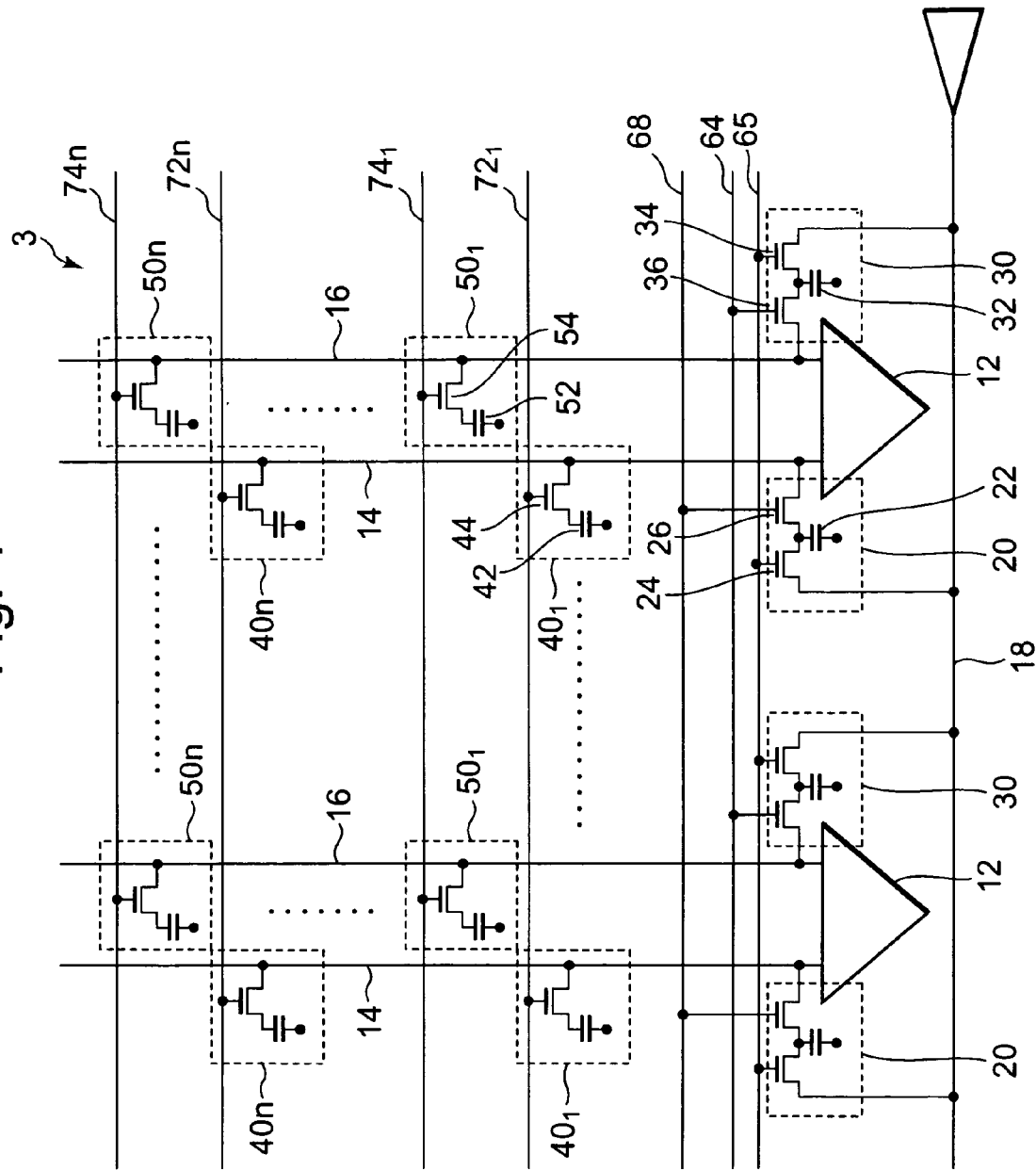
FIG. 4 is s circuit diagram showing a third exemplary embodiment of a semiconductor memory device according to the present invention.

FIG. 4 is s circuit diagram showing a third exemplary embodiment of a semiconductor memory device according to the present invention. In DRAM 3 is provided with a word line 65 in place of a word line 62 and a word line 66 (see FIGS. 1 and 3). That is, the gates of transistors 24 and 34 are connected to a common word line 65. In this embodiment, writing a reference potential to a reference 20 and a reference 30 is therefore started simultaneously and ended simultaneously. Other constitutions and behaviors of DRAM 3 are identical with those of DRAM 1.

In this embodiment, connection of the gates of transistors 24 and 34 to a common word line 65 facilitates writing of a reference potential simultaneously to reference cells 20 and 30. Since this embodiment needs no control circuit that controls a time to write the reference potential to both the reference cells 20 and 30, the circuit configuration of DRAM 3 is simplified by just that much. This contributes to size and cost reduction of the DRAM 3. Other effects of this embodiment are identical with those of the first embodiment.

Fourth Embodiment

Figure 5:
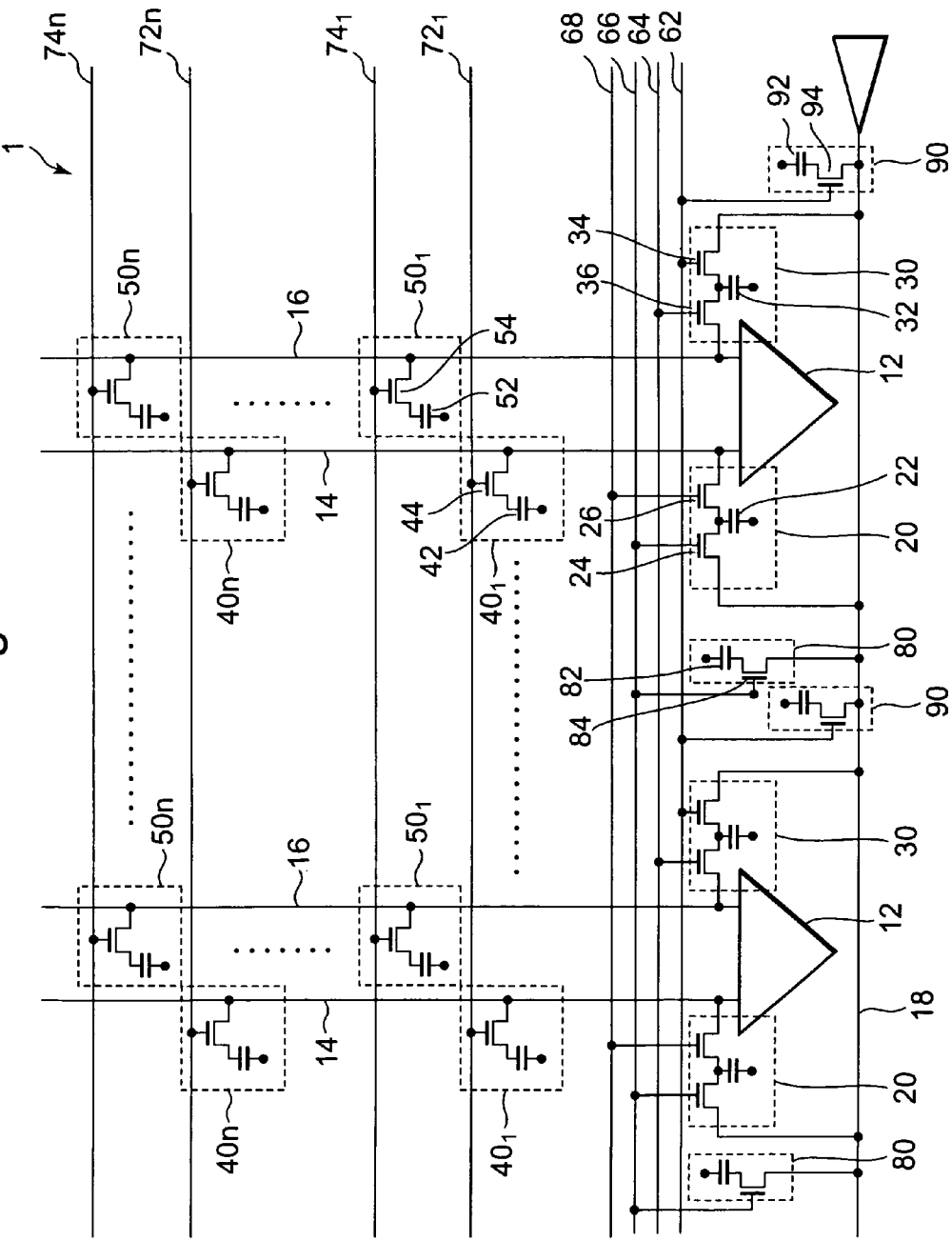
FIG. 5 is a circuit diagram showing a fourth exemplary embodiment of a semiconductor memory device according to the present invention.

FIG. 5 is a circuit diagram showing the fourth exemplary embodiment of a semiconductor memory device according to the present invention. DRAM 1 is a semiconductor memory device of conducting reading of data by comparison between the potential of a memory cell and a reference potential of a reference cell and includes a capacitor 22 (first capacitor), capacitor 32 (second capacitor), and capacitors 82, 92 (third capacitor). DRAM 1 is constituted such that writing of the reference potential to the capacitor 22 and the capacitor 82 is started simultaneously. In the same manner, it is constituted such that writing of the reference potential to the capacitor 32 and the capacitor 92 is started simultaneously.

The capacitor 22 and the capacitor 32 are disposed in a reference cell 20 (first reference cell) and a reference cell 30 (second reference cell) respectively. On the other hand, the capacitor 82 and the capacitor 92 are disposed in a potential compensation cell 80 and a potential compensation cell 90, respectively. Each of the potential compensation cells 80, 90 is a dummy cell. The dummy cell is a cell that is neither a memory cell nor reference cell. The dummy cell is disposed preferably at the end of the memory sell array.

The reference cell 20 and the reference cell 30 are connected to a bit line 14 and a bit line 16, respectively. On the other hand, each of the potential compensation cells 80, 90 is connected to neither the bit line 14 nor the bit line 16. The bit line 14 and the bit line 16 are connected to an identical sense amplifier 12. The reference cells 20, 30 and the potential compensation cells 80, 90 are connected to a common potential line 18. Writing of a reference potential to the reference cells 20, 30 and the potential compensation cells 80, 90 is conducted by way of the potential line 18 to be described later.

The reference cell 20 comprises the capacitor 22, a transistor 24 (first transistor), and a transistor 26. The transistor 24 is connected at one of a source and a drain to the potential line 18 and at the other of them to one end of the capacitor 22. The other end of the capacitor 22 is connected, for example, to ½ Vcc. The transistor 26 is connected at one of a source and a drain to the bit line 14 and at the other of them to the one end of the capacitor 22. A word line 66 and a word line 68 are connected to the gates of the transistor 24 and the transistor 26, respectively.

The reference cell 30 comprises the capacitor 32, a transistor 34 (second transistor) and a transistor 36. The transistor 34 is connected at one of a source and a drain to the potential line 18 and at the other of them to one end of the capacitor 32. The other end of the capacitor 32 is connected, for example, to ½ Vcc. The transistor 36 is connected at one of a source or a drain to the bit line 16 and at the other of them to the one end of the capacitor 32. A word line 62 and a word line 64 are connected to the gates of the transistor 34 and the transistor 36, respectively.

The potential compensation cell 80 is composed of a capacitor 82 and a transistor 84 (third transistor). The transistor 84 is connected at one of a source and a drain to the potential line 18 and at the other of them to one end of the capacitor 82. The other end of the capacitor 82 is connected, for example, to ½ Vcc. The word line 66 is connected to the gate of the transistor 84. That is, the word line 66 is connected to the gates of both of the transistor 24 and the transistor 84. With the constitution described above, the transistor 24 and the transistor 84 are turned on simultaneously by the activation of the word line 66. That is, it is constituted such that writing of the reference potential to the capacitor 22 and the capacitor 82 is started simultaneously.

The potential compensation cell 90 is composed of the capacitor 92 and a transistor 94 (third transistor). A transistor 94 is connected at one of a source and a drain to the potential line 18 and at the other of them to one end of the capacitor 92. The other end of the capacitor 92 is connected, for example, to ½ Vcc. The word line 62 is connected to the gate of the transistor 94. That is, the word line 62 is connected to the gates of both of the transistor 34 and the transistor 94. With the constitution described above, the transistor 34 and the transistor 94 are turned on simultaneously by activation of the word line 62. That is, it is constituted such that writing of the reference potential to the capacitor 32 and the capacitor 92 is started simultaneously.

Memory cells $40_1$ to $40_n$ are connected to the bit line 14. n is an integer of 2 or greater, and for example, 128 or 256. Each of the memory cells $40_1$ to $40_n$ is composed of a capacitor 42 and a transistor 44. The transistor 44 is connected at one of a source and a drain to a bit line 14 and the other of them to one end of the capacitor 42. The other end of the capacitor 42 is connected, for example, to ½ Vcc. The word lines $72_1$ to $72_n$ are connected to the gates of the transistors 44 of the memory cells $40_1$ to $40_n$, respectively.

Memory cells $50_1$ to $50_n$ are connected to the bit line 16. Each of the memory cells $50_1$ to $50_n$ comprises a capacitor 52 and a transistor 54. The transistor 54 is connected at one of a source and a drain to the bit line 16 and the other of them to one end of the capacitor 52. The other end of the capacitor 52 is connected, for example, to ½ Vcc. The word lines $74_1$ to $74_n$ are connected to the gates of the transistors 54 of the memory cells $50_1$ to $50_n$, respectively.

Figure 6:
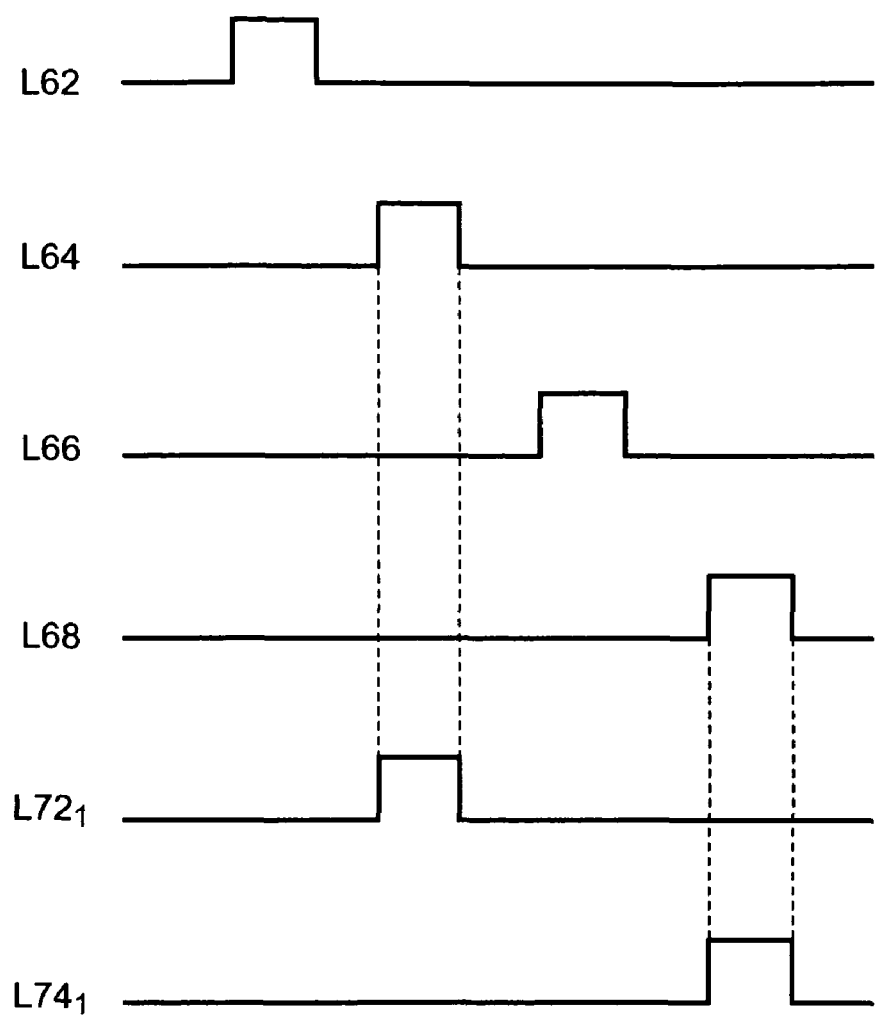
FIG. 6 is a timing chart for explaining the reading operation of data in the semiconductor memory device of FIG. 1.

Description is to be made to the data reading operation in DRAM 1 as a preferred embodiment of the data reading method according to the present invention with reference to a timing chart of FIG. 6. In the drawing, potentials of the word lines 62, 64, 66, 68, $72_1$, $74_n$ are represented by lines L62, L64, L66, L68, L$72_1$, L$74_1$, respectively. In this embodiment, an example of conducting reading of data continuously from the memory cell $40_1$ and the memory cell $50_1$ is shown as an example.

By turning the transistor 34 on by activation of the word line 62, a reference potential is written through the potential line 18 to the capacitor 32 of the reference cell 30. In this case, the reference potential is written through the potential line 18 also to the capacitor 92 of the potential compensation cell 90. The reference potential is set, for example, to ½ Vcc (one-half of the power source potential). Then, after turning the transistor 34 to OFF by the deactivating the word line 62, the word line 64 and the word line $72_1$ are activated. Then, the transistor 36 and the transistor 44 are turned on, and the potential of the memory cell $40_1$ and the potential of the reference cell 30 are compared by a sense amplifier 12, by which data is read from the memory cell $40_1$. Then, the transistor 36 and the transistor 44 are turned OFF by deactivating the word line 64 and the word line $72_1$.

Successively, by turning on the transistor 24 by activation of the word line 66, the reference potential is written by way of the potential line 18 to the capacitor 22 of the reference cell 20. In this case, the reference potential is written by way of the potential line 18 also to the capacitor 82 of the potential compensation cell 80. Then, after turning OFF the transistor 24 by deactivating the word line 66, the word line 68 and the word line $74_1$ are activated. This turns the transistor 26 and the transistor 54 and data is read from the memory cell $50_1$. Then, the transistor 26 and the transistor 54 are turned OFF by deactivating the word line 68 and the word line $74_1$.

The effect of this embodiment is to be described. In this embodiment, writing of the reference potential to the capacitor 22 and the capacitor 82 is started simultaneously. That is, upon writing of the reference potential to the reference cell 20, the reference potential is written also to the potential compensation cell 80 disposed separately from the reference cell 20.

Accordingly, in a case where potential lowering occurs to the potential line 18 that supplies the reference potential to the reference cell 20, charges are supplied from the capacitor 82 constituting the potential compensation cell 80 to the potential line 18. On the other hand, in a case where potential increase of the potential line 18 occurs, charges are discharged from the potential line 18 to the capacitor 82 constituting the potential compensation cell 80. This can suppress the potential fluctuation of the potential line 18. Accordingly, it is possible to prevent reading of the data from each of the memory cells $50_1$ to $50_n$ in a state where the potential of the reference cell 20 is apart from a predetermined reference potential. In the same manner, this can prevent reading of the data from each of the memory cells $40_1$ to $40_n$ in a state where the potential of the reference cell 30 is apart from a predetermined reference potential. Since this stabilizes the potential written to the reference cell, the reading operation from the memory cell is stabilized to enlarge the operation margin of DRAM 1. Accordingly, it is possible to sufficiently follow a high speed operation as required for the logic embedded memory.

Further, since the gate of the transistor 24 and the gate of the transistor 84 are connected to the common word line 66, the reference potential can be easily written to the reference cell 20 and the potential compensation cell 80 simultaneously. Further, since a control circuit for controlling the timing of writing the reference potential to the reference cell 20 and the potential compensation cell 20 is no more necessary, the circuit structure of DRAM 1 can be simplified by so much. This serves to the reduction in the size and decrease in the cost of the DRAM 1. The situation is also identical for the reference cell 30 and the potential compensation cell 90.

Further, in a case where the potential compensation cells 80, 90 are dummy cells disposed to the end of the memory cell array, fabrication for the reference cells 20, 30 and the memory cells $40_1$ to $40_n$, $50_1$ to $50_n$ is facilitated upon manufacture of the DRAM 1. This is because the reference cells 20, 30 or the memory cells $40_1$ to $40_n$, $50_1$ to $50_n$ can be prevented from being disposed to the end of the memory cell array which is difficult for fine fabrication.

By the way, as a method of stabilizing the potential written to the reference cell, it may be considered to deactivate the transistor of the reference cell connected to the bit line before activation of the sense amplifier as disclosed in the Patent Document 2. This can prevent the potential of the reference cell from following the potential fluctuation of the bit line upon differential amplification by the sense amplifier.

However, such a method requires a certain extent of time from writing of the reference potential by turning on the transistor of the reference cell to the turning OFF of the transistor. This makes it difficult to shorten the time from the rising of the word line to the activation of the sense amplifier. This brings about a problem that the operation speed is retarded, for example, in DRAM (particularly, logic embedded DRAM) requiring high speed random access. Accordingly, the method of the Patent Document 2 cannot be applied to the logic embedded memory requiring high speed operation.

Further, the method described above also involves a problem that the balance of capacitance is lost between two bit lines connected to a sense amplifier upon differential amplification by the sense amplifier. This is because the capacitor is connected to one bit line, whereas the capacitor is not connected to the other bit line. This causes an error in the reading of data. Accordingly, the method of this embodiment is excellent over the method of No. Hei 06(1994)-012860 as a method of stabilizing the potential written to the reference cell.

Fifth Embodiment

Figure 7:
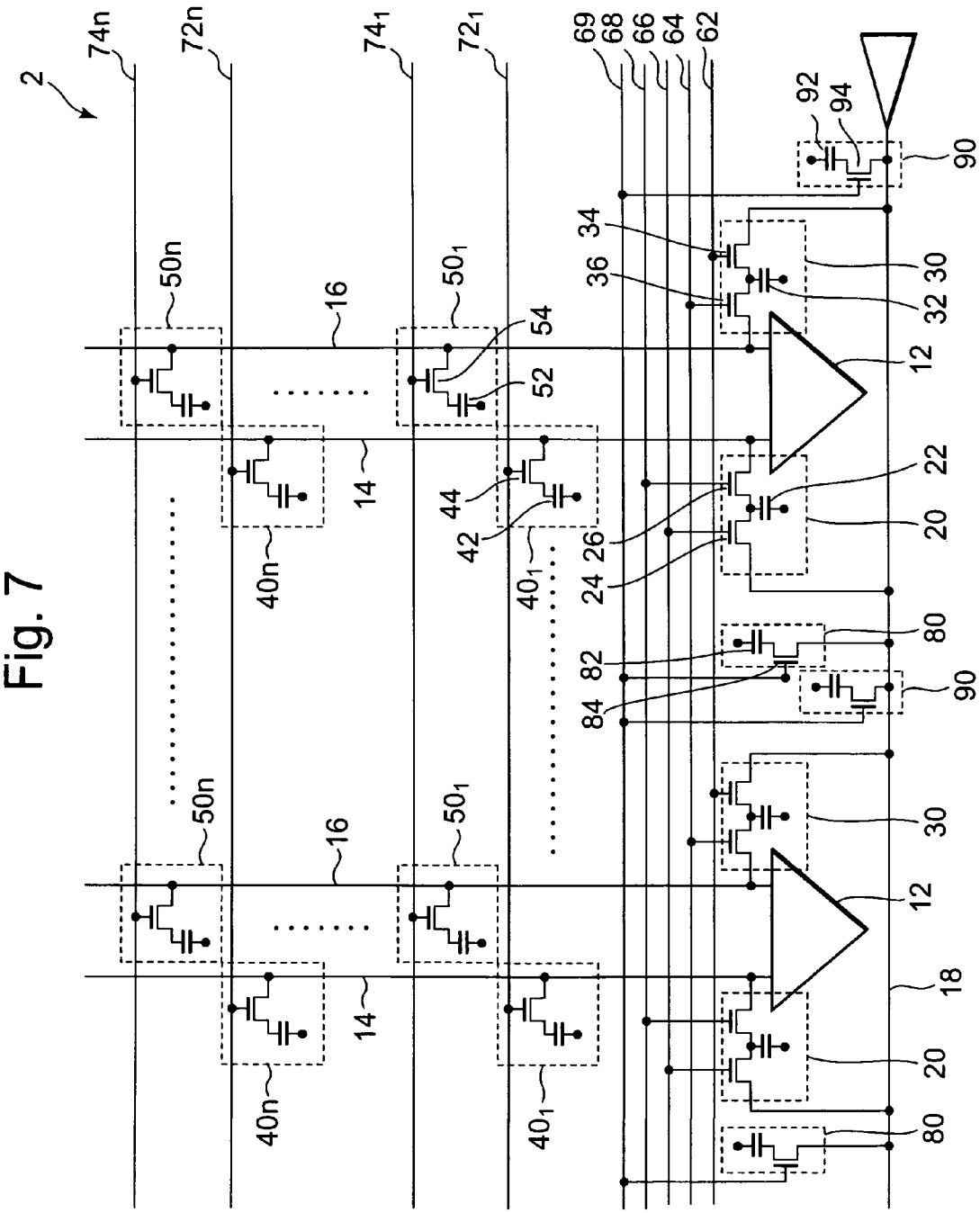
FIG. 7 is s circuit diagram showing a fifth exemplary embodiment of a semiconductor memory device according to the present invention.

FIG. 7 is a circuit diagram showing the fifth exemplary embodiment of the semiconductor memory device according to the present invention. In DRAM 2, in addition to a word line 66 (first word line) and a word line 62 (second word line) connected to the gates of transistors 24, 34 in reference cells 20, 30, a word line 69 (third word line) connected to the gates of transistors 84, 94 in potential compensation cells 80, 90 is disposed. Further, the word line 66 (first word line) and the word line 69 (third word line) are connected to a control circuit (not illustrated) having a function of controlling the timing for simultaneous activation. In the same manner, the word line 62 (second word line) and the word line 69 (third word line) are also connected to a control circuit (not illustrated) having a function of controlling the timing for the simultaneous activation. Other constitutions of DRAM 2 are identical with those of DRAM 1.

Figure 8:
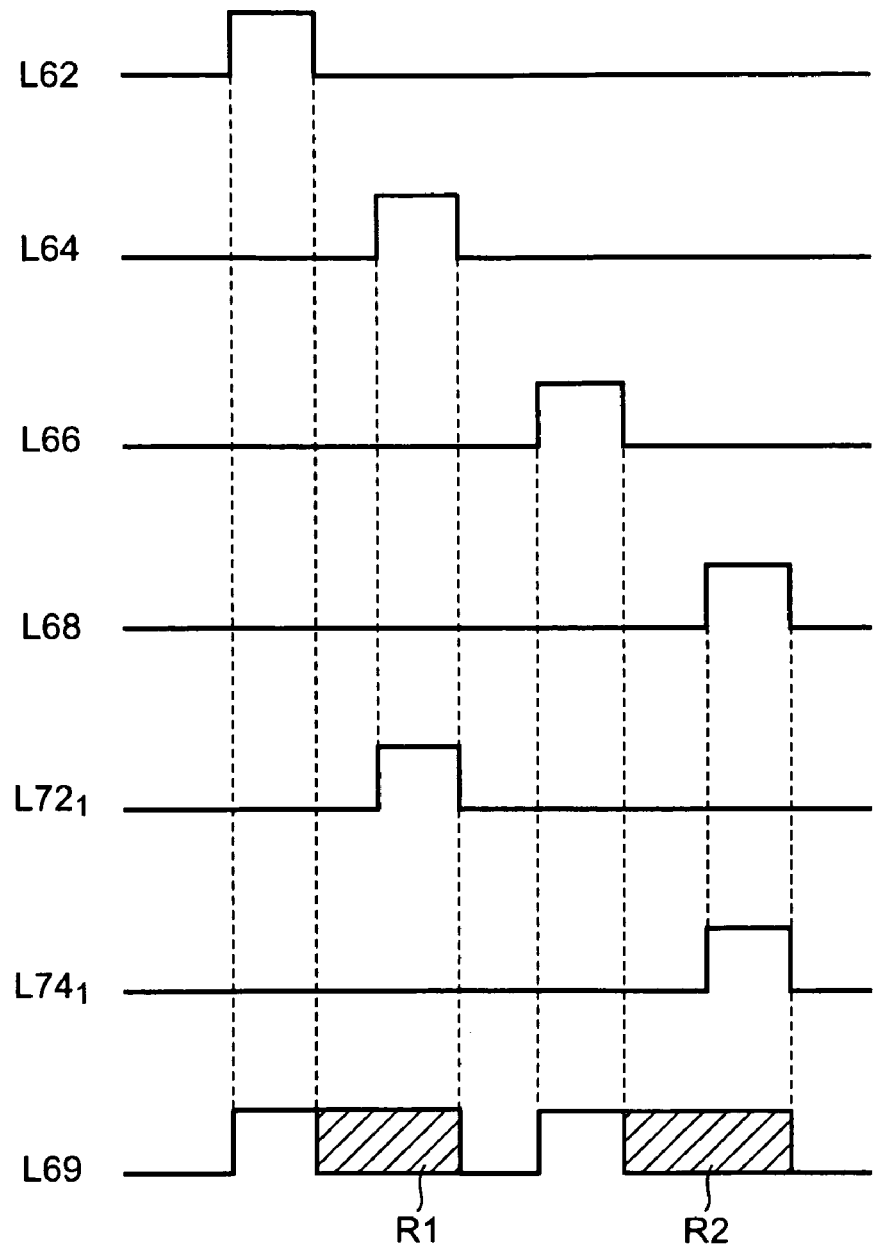
FIG. 8 is a timing chart for explaining the reading operation of data in the semiconductor memory device of FIG. 3.

A reading operation of data in the DRAM 2 as an embodiment of the data reading method according to the invention is to be described with reference to the timing chart of FIG. 8. In the drawing, the potential of the word line 69 is represented by a line L69. Meanings for other lines are as described in FIG. 6. In this embodiment, a case of conducting reading data from the memory cell $40_1$ and the memory cell $50_1$ continuously is shown as an example.

At first, by turning on the transistor 34, by activation of the word line 62, a reference potential is written through the potential line 18 to the capacitor 32 of the reference cell 30. In this case, the transistors 84, 94 are also turned on by activating also the word line 69 simultaneously with the word line 62. Thus, writing of the reference potential is conducted by way of the potential line 18 also to the capacitors 82, 92 of the potential compensation cells 80, 90 simultaneously with the reference cell 30.

The word line 69 can be deactivated at an optional timing in a hatched area R1. That is, for the writing of the reference potential to the capacitor 32 and the capacitors 82, 92, it may suffice that only the starting thereof is conducted simultaneously and the end thereof may not always be conducted simultaneously. In other words, the writing time of the reference potential to the capacitor 32 and the writing time of the reference potential to the capacitors 82, 92 may be different from each other. In this case, the writing time to the capacitors 82, 92 of the potential compensation cells 80, 90 is longer than the writing time to the capacitor 32 of the reference cell 30.

Then, after turning OFF the transistor 34 by deactivating the word line 62, the word line 64 and the word line $72_1$ are activated. Then, the transistor 36 and the transistor 44 are turned on, and the potential of the memory cell $40_1$ and the potential of the reference cell 30 are compared by the sense amplifier 12; thereby, data is read from the memory cell $40_1$. Then, the transistor 36 and the transistor 44 are turned OFF by deactivating the word line 64 and the word line $72_1$.

Then, by turning on the transistor 24 by activation of the word line 66, the reference potential is written by way of the potential line 18 to the reference cell 20. In this case, the transistor 84, 94 are also turned on by activating also the word line 69 simultaneously with the word line 66. Thus, writing of the reference potential is conducted by way of the potential line 18 also to the capacitors 82, 92 of the potential compensation cells 80, 90 simultaneously with the reference cell 20. The word line 69 can be deactivated at an optional timing in a hutched area R2. Then, after turning OFF the transistor 24 to OFF by deactivating the word line 66, the word line 68 and the word line $74_1$ are activated. Thus, the transistor 26 and the transistor 54 are turned on and the data is read from the memory cell $50_1$. Then, the transistor 26 and the transistor 54 are turned OFF by deactivating the word line 68 and the word line $74_1$.

In this embodiment, the transistors 24, 34 in the reference cells 20, 30 and the transistors 84, 94 in the potential compensation cells 80, 90 are connected to separate word lines. Accordingly, it is possible to make the writing time of the reference potential to the potential compensation cells 80, 90 longer than the writing time of the reference potential to the reference cells 20, 30. This can more effectively suppress the potential fluctuation of the potential line 11.

Figure 9:
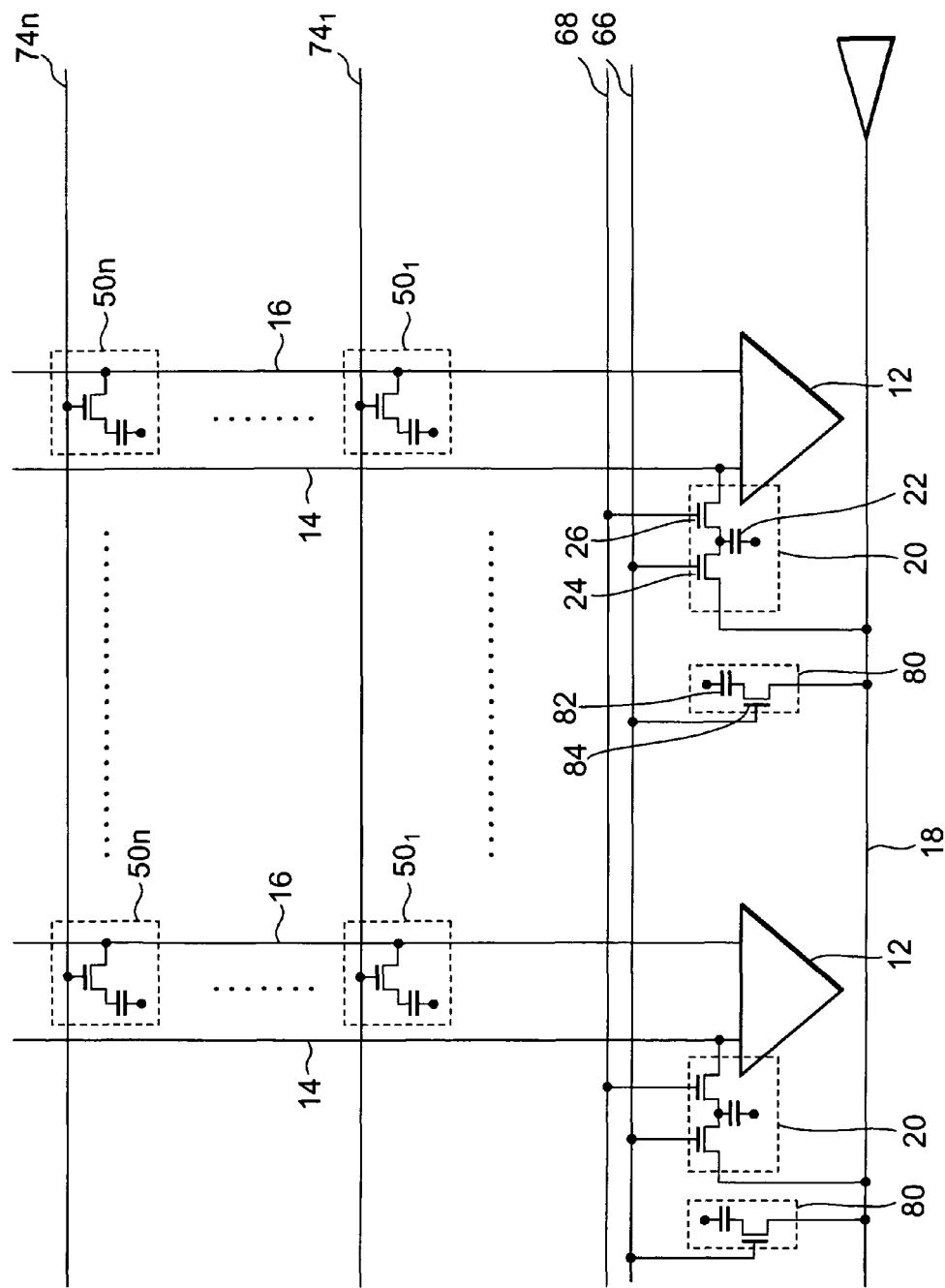
FIG. 9 is a circuit diagram showing a semiconductor memory device according to a modified example of an embodiment.

The present invention is not restricted to the embodiments described above but various modifications are possible. For example, in the embodiments described above, an example of connecting the reference cells to both of the bit line 14 and the bit line 16 is shown. However, the reference cell may also be connected only to one of the bit line 14 and the bit line 16. FIG. 9 shows an example where the reference cell is connected only to the bit line 14. The drawing corresponds to an embodiment in which the reference cell 30, the potential compensation cell 90, the memory cells $40_1$ to $40_n$, and the word lines 62, 64, $72_1$ to $72_n$ are removed from FIG. 1.

Moreover, the embodiments described above show a case of applying the present invention to the logic embedded DRAM as an example. However, the present invention is applicable to increase of the speed for semiconductor memory devices in general of a type for reading the data from the memory cell by comparison with the reference cell. Such a semiconductor memory device includes the logic embedded DRAM, as well as DRAM, FeRAM (Ferroelectric RAM), MRAM (Magnetoresistive RAM), etc. requiring high speed random access.

Further, it is noted that, Applicant's intent is to encompass equivalents of all claim elements, even if amended later during prosecution.

What is claimed is:

1. A semiconductor memory device, comprising:
   a sense amplifier;
   first and second bit lines connected to the sense amplifier;
   a reference cell coupled to the first bit line,
   a memory cell coupled to the second bit line; and
   a dummy cell, simultaneously with the reference cell, written with a reference potential;
   wherein said reference cell includes a first capacitor to be written with the reference potential, and said dummy cell includes a second capacitor to be written with the reference potential; the semiconductor memory device, further comprising:
   a potential line for providing the reference potential;
   a first transistor coupled between the potential line and the first capacitor; and
   a second transistor coupled to the potential line and the second capacitor.

2. The semiconductor memory device according to claim 1, further comprising a
   a word line connected to gates of the first and second transistors.

3. The semiconductor memory device according to claim 1, further comprising:
   a first word line connected to a gate of the first transistor; and a second word line independently provided from the first word line and connected to a gate of the second transistor.

4. A method of reading data from a semiconductor memory device, comprising:
   simultaneously writing a reference potential to a reference cell and a dummy cell, said reference cell coupled to a sense amplifier, said dummy cell independently provided from said sense amplifier; and
   comparing the reference potential of said reference cell with a potential in a memory cell by using the sense amplifier;
   wherein the simultaneously writing of the reference potential to the reference and dummy cells is performed by writing the reference potential to a first capacitor provided in the reference cell, and writing the reference potential to a second capacitor provided in the dummy cell;
   wherein the simultaneously writing of the reference potential to the reference and dummy cells is performed by writing the reference potential on a reference potential line to the first capacitor via a first transistor, and the reference potential to the second capacitor via a second transistor.

5. The method according to claim 4, comprising:
   simultaneously activating first and second word lines connected to the first and second transistors, respectively.

6. The method according to claim 4, comprising:
   activating a word line connected to the first and second transistors.

\* \* \* \* \*